United States Patent
Little et al.

(10) Patent No.: US 7,936,223 B2
(45) Date of Patent: May 3, 2011

(54) LOW SPUR PHASE-LOCKED LOOP ARCHITECTURE

(75) Inventors: James M. Little, Sacramento, CA (US);
Perry Leigh Heedley, Folsom, CA (US);
David Vieira, San Jose, CA (US);
Maoyou Sun, Folsom, CA (US)

(73) Assignee: Vintomie Networks B.V., LLC, Dover, DE (US)

( * ) Notice: Subject to any disclaimer, the term of this patent is extended or adjusted under 35 U.S.C. 154(b) by 158 days.

(21) Appl. No.: 12/284,924

(22) Filed: Sep. 25, 2008

(65) Prior Publication Data
US 2009/0231046 A1 Sep. 17, 2009

Related U.S. Application Data

(63) Continuation of application No. 12/012,909, filed on Feb. 5, 2008, now abandoned.

(60) Provisional application No. 60/900,180, filed on Feb. 7, 2007.

(51) Int. Cl.
*H03L 7/00* (2006.01)
(52) U.S. Cl. ............... 331/17; 331/15; 331/16; 331/34; 331/36 C; 331/177 R; 331/182; 331/183; 327/148; 327/157
(58) Field of Classification Search .............. 331/15, 331/16, 34, 36 C, 177 R, 182, 183; 327/148, 327/157
See application file for complete search history.

(56) References Cited

U.S. PATENT DOCUMENTS

| | | | | |
|---|---|---|---|---|
| 6,385,265 B1 * | 5/2002 | Duffy et al. | | 375/374 |
| 6,636,105 B2 * | 10/2003 | Soda | | 327/537 |
| 6,774,736 B1 * | 8/2004 | Kwek et al. | | 331/177 V |
| 6,825,730 B1 * | 11/2004 | Sun | | 331/16 |
| 6,906,596 B2 * | 6/2005 | Kitamura et al. | | 331/36 C |
| 7,064,622 B2 * | 6/2006 | Jasa et al. | | 331/117 R |
| 7,439,783 B2 * | 10/2008 | Weller et al. | | 327/157 |
| 7,659,783 B2 * | 2/2010 | Tai | | 331/17 |
| 2005/0185746 A1 * | 8/2005 | Jung | | 375/374 |
| 2005/0195301 A1 * | 9/2005 | Horiuchi | | 348/294 |
| 2006/0152295 A1 * | 7/2006 | Miyashita et al. | | 331/185 |

OTHER PUBLICATIONS

Ayman ElSayed, Akbar Ali and M. I. Elmasry; "*Differential PLL for Wireless Applications Using Differential CMOS LC-VCO and Differential Charge Pump*"; Proceedings of Int. Symp. on Low Power Electronics and Design; pp. 243-248, Aug. 1999.
Li Lin, Luns Tee, Paul R. Gray; "*A 1.4GHz Differential Low-Noise CMOS Frequency Synthesizer using a Wideband PLL Architecture*"; ISSCC Digest of Technical Papers; pp. 204-205; Feb. 2000.

(Continued)

*Primary Examiner* — Arnold Kinkead
*Assistant Examiner* — Richard Tan
(74) *Attorney, Agent, or Firm* — Dorsey & Whitney LLP

(57) ABSTRACT

A low spur phase-locked loop (PLL) architecture is provided. A frequency-synthesizing PLL that includes a differential Kvco gain linearization circuit with adjustable DC offset is used to reduce clock jitter. The free-running oscillation frequency of the VCO of the PLL is centered near the desired frequency using programmable loads to minimize the required control voltage range. The PLL uses a differential architecture that includes a charge pump that compensates for variations in Kvco and a LC tank oscillator with differential controlled varactor. The differential PLL architecture demonstrates that the reference spur can be well controlled to below −80 dBc.

9 Claims, 5 Drawing Sheets

OTHER PUBLICATIONS

C. Lam and B. Razavi; "*A 2.6-GHz/5.2-GHz frequency synthesizer in 0.4-um CMOS technology*"; IEEE Journal of Solid-State Circuits, vol. 35, Issue 5, May 2000; pp. 788-794.

C. M. Hung and K. K. O. "*A fully integrated 1.5-V 5.5-GHz CMOS phase-locked loop*"; IEEE Journal of Solid-State Circuits; vol. 37, pp. 521-525; Apr. 2002.

Nicola Da Dalt and Christoph Sandner; "*A Subpicosecond Jitter PLL for Clock Generation in 0.12-μm Digital CMOS*"; IEEE Journal of Solid-State Circuits, vol. 38; No. 7; pp. 1275-1278; Jul. 2003.

S. Pellerano, S. Laventino, C. Samori and A. Lacaita; "*A 13.5-mW 5-GHz frequency synthesizer with dynamic-logic frequency divider*"; IEEE Journal of Solid-State Circuits, vol. 39; pp. 378-383; Feb. 2004.

Hyunwon Moon et al., "*A Fully Differential LC-VCO Using a New Varactor Control Structure*"; IEEE Microwave and Wireless Components Letters; vol. 14, No. 9; pp. 410-412; Sep. 2004.

Circuits and Systems I: Regular Papers, IEEE Transactions [see also Circuits and Systems I: Fundamental Theory and Applications, IEEE Transactions on] vol. 53, No. 3; pp. 526-533; Mar. 2006.

* cited by examiner

LOW SPUR PHASE-LOCKED LOOP ARCHITECTURE

CROSS-REFERENCE TO RELATED APPLICATIONS

This application is a continuation of U.S. application Ser. No. 12/012,909, filed on Feb. 5, 2008 now abandoned. Application Ser. No. 12/012,909 claims the benefit of U.S. provisional patent application No. 60/900,180 filed Feb. 7, 2007, which is incorporated herein by reference.

FIELD OF THE INVENTION

The present invention relates generally to phase-locked loops. More particularly, the invention is directed to a low spur PLL using differential architecture.

BACKGROUND

Clock jitter or phase noise is a very common and important specification for many applications. Phase-locked loops (PLLs) are commonly employed to reduce clock jitter. However, the reference spur in a phase locked loop can result in a large jitter. Many techniques have been proposed to reduce reference spur in PLL, like reducing the gain (Kvco) of the voltage-control oscillator (VCO), or using a higher order filter to reduce VCO control voltage ripple. Previous works have demonstrated that the reference spur level is controlled as low as −65 dBc using third-order loop filter. One recent work controls the reference spur below −74 dBc through reducing Kvco. With previous techniques the PLL architecture is complicated and the added extra PLL blocks may burn more power or introduce new noise sources.

SUMMARY

In this invention, the PLL uses a differential architecture which consists of a charge pump configured to compensate for variations in Kvco, and a LC tank oscillator with differential controlled varactor. Through use of the invention, the PLL architecture demonstrates that the reference spur can be well controlled to below −80 dBc.

DETAILED DESCRIPTION

Figure 1:
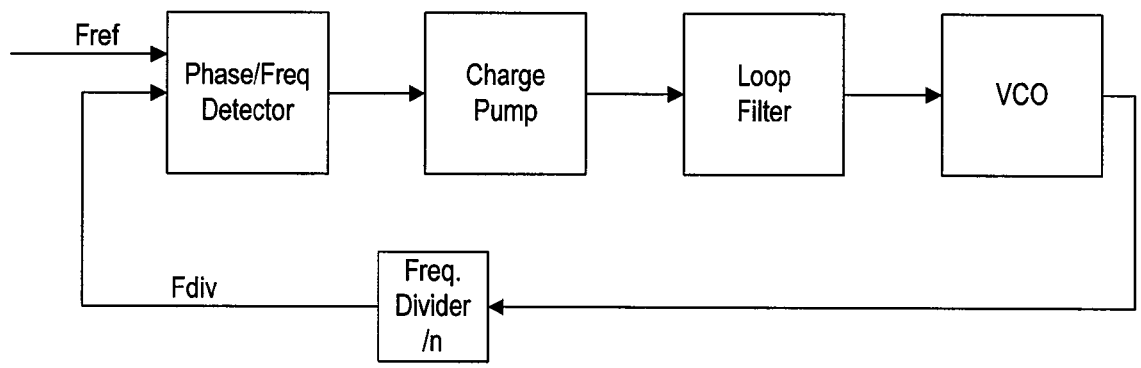
FIG. 1 is a block diagram of a phase-locked loop (PLL).

Referring to FIG. 1, a PLL may include a phase detector coupled to a charge pump. The charge pump may be coupled to a loop filter, which in turn is coupled to a voltage-controlled oscillator (VCO). The VCO may be coupled to a frequency divider, which may be coupled back to the phase detector. The phase detector compares the relative phase of the incoming reference clock, Fret and the (possibly divided down) output clock, Fdiv. An output pulse is generated based on the difference between arrival times of the two clock edges. The output pulse may be provided to the charge pump. The charge pump itself is a well understood in the art pair of NMOS/PMOS differential pairs used to steer mirrored values of the input current, Icp to either side of the loop filter depending on the values from the phase detector, as shown in FIG. 2.

Figure 2:
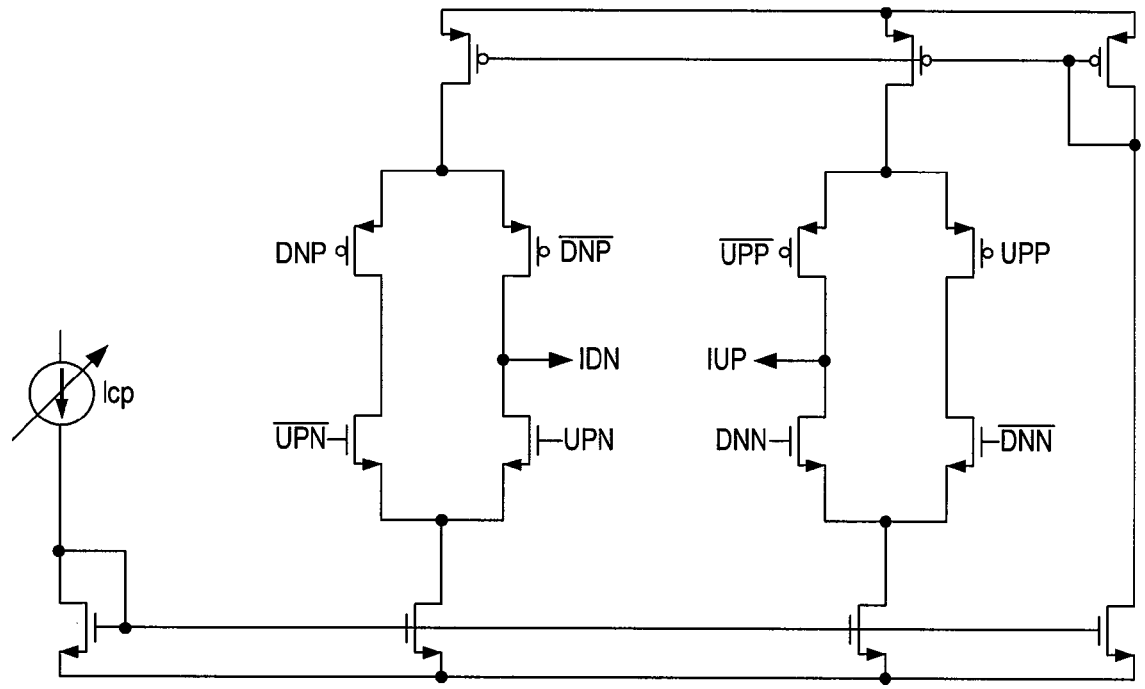
FIG. 2 is a schematic illustration of a charge pump circuit.

As shown in FIG. 2, differential signals DNP and DNN as well as UPP and UPN received from the phase detector. The differential signals may be used (along with their inverses, inverse DNP, DNN, UPP, UPN) to control differential pair transistors as shown and provide output currents IDN and/or IUP to the loop filter. The output currents are generated based on an input current Icp.

The generation of the charge pump current, Icp, will be detail below and is a key to the invention.

The concept of adjusting the charge pump gain to compensate for variation in the VCO gain (Kvco) is known in the art for single ended VCOs. We improve and extend this basic idea to include correction for differential controlled VCOs and further use this technique to tune the VCO fixed load capacitors to center the VCO at it's optimal operating point. Before discussing the adjustment of charge pump gain to compensate for VCO gain, the remaining components of the FIG. 1 PLL will be briefly described.

The loop filter takes the current output from the charge pump (IDN/IUP from FIG. 2) and converts it to a voltage and applies a continuous time filter function. The loop filter is the standard lead-lag differential architecture that is well-known in the art.

Figure 3:
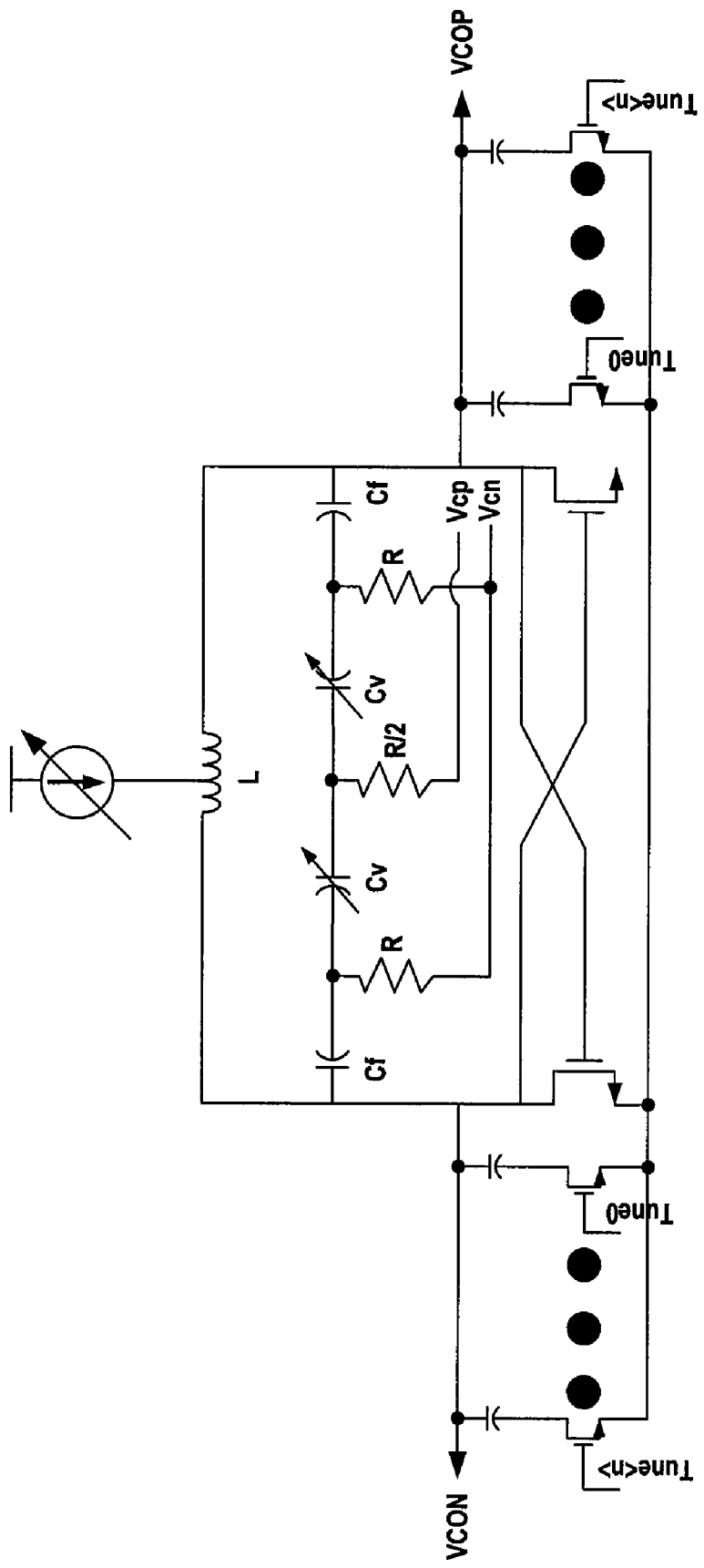
FIG. 3 is a schematic illustration of an LC tank voltage-controlled oscillator (VCO).

The voltage-controlled oscillator, shown in FIG. 3, uses differentially controlled (floating) variable capacitor (varactor) to reduce noise coupling (the varactors are shown in FIG. 3 labeled Cv) as well as switchable fixed capacitors to adjust frequency range (switchable fixed capacitors are shown in FIG. 3 labeled Tune0 through Tune<n>). Some additional fixed capacitance, labeled Cf in FIG. 3, is also provided. The tank bias current, shown in FIG. 3 directed into the inductor labeled L, is also adjustable to compensate for variations over process, voltage, temperature or operating frequency. Resistances shown as R and R/2 in FIG. 3 are also provided. In this manner, the VCO generates the differential output voltage shown as VCON and VCOP in FIG. 3.

The PLL controls the oscillation frequency of the VCO of FIG. 3 by adjusting the differential control voltage, Vcp/Vcn. The voltage-to-frequency gain of the VCO is a critical parameter in the jitter performance of the PLL and is generally noted as Kvco and is expressed in Hz/V. There is an optimum value for Kvco to minimize jitter, however, there is a wide range of values for Kvco over process and temperature corners, as shown in the graph of FIG. 4.

Figure 4:
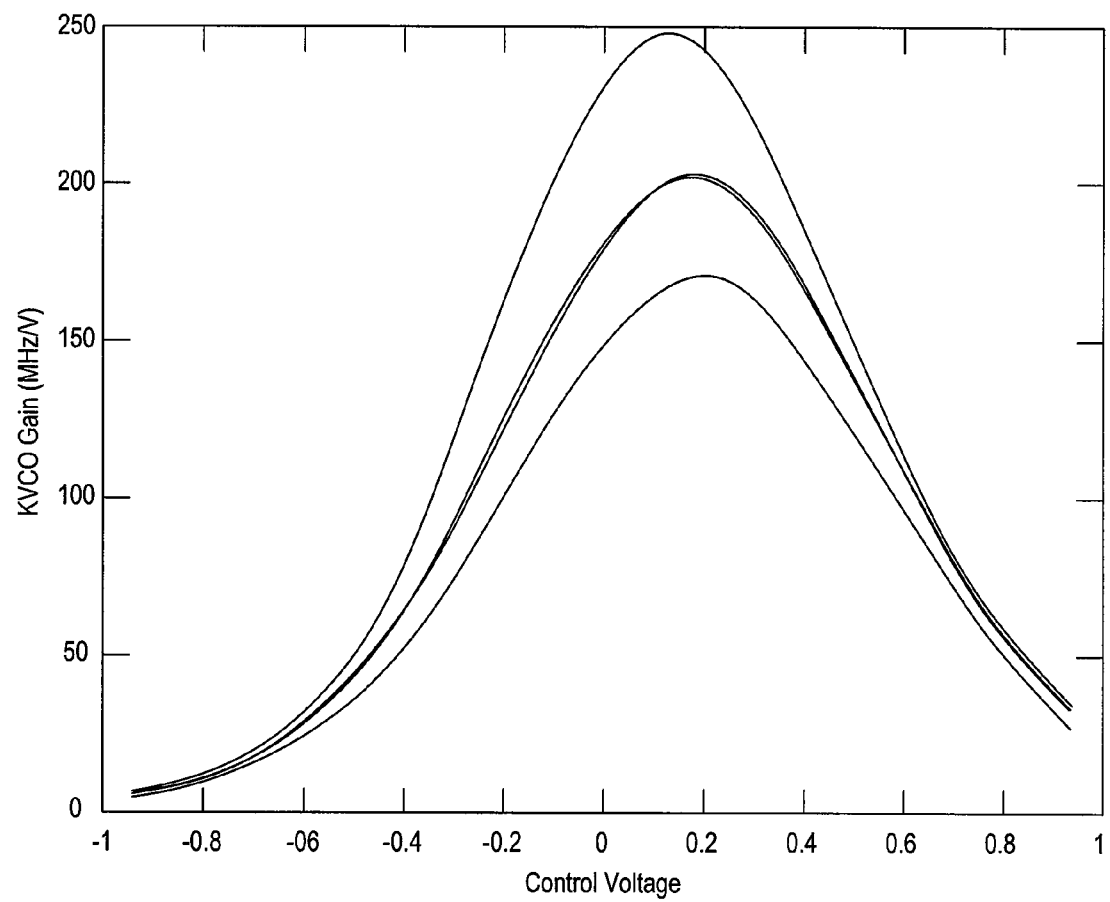
FIG. 4 is a graph illustrating VCO gain versus control voltage at four different process corners.

As shown in FIG. 4, the VCO gain may vary with voltage and over process and temperature conditions.

Previous work has shown how this variation may be somewhat compensated for by modifying the charge pump current, Icp inversely to that the change in Kvco. However, in extending this process to a differential structure, such as the differential VCO of FIG. 3, there are several deficiencies in the prior art that the current invention overcomes.

Figure 5:
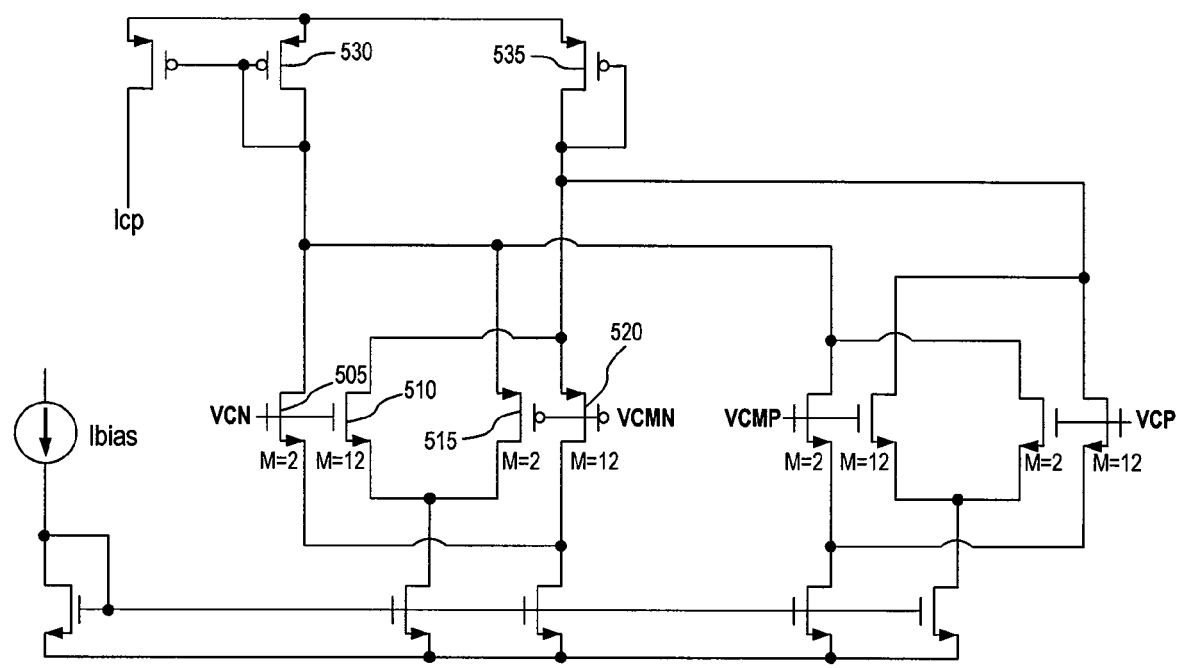
FIG. 5 is a schematic illustration of a Kvco gain correction circuit.

FIG. 5 shows a schematic illustration of a Kvco gain correction circuit that may be used to alter Icp, the current used in the charge pump shown in FIG. 2, to compensate for changes in the VCO gain. The Kvco gain correction circuit utilizes a bias current, Ibias to generate the charge pump current Icp or a correction to the charge pump current Icp. The amount of current provided to Icp is determined in part by the transistors shown in FIG. 5. The transistors shown in FIG. 5 include transistors 505, 510, 515, 520, 530, and 535. VCN and VCP—the differential control voltage generated by the loop filter and applied to the VCO of FIG. 3—are used to control the gates of two transistors each. For example, the transistors 505 and 510 are coupled to VCN at their gate terminals. The two transistors may be sized differently, as shown in FIG. 5 with the designations M=2 and M=12. The transistor 505 has a size M=2. The transistor 510 has a size M=12. Adjustable offset voltages VCMP and VCMN are applied to the gates of two transistors each. For example, the transistors 515 and 520 are coupled to VCMN at their gate terminals. Again, the two transistors may be sized differently, as shown in FIG. 5 with the designations M=2 and M=12. The transistor 515 has a size M=2, and the transistor 520 has a size M=12. As shown above in FIG. 4, the shape of the Kvco gain curve is not centered about 0.0V (differential loop filter voltage). The invention incorporates an adjustable offset via VCMP/VCMN into the charge pump Kvco gain correction circuitry (shown in FIG. 5) that allows adjusting the optimal center voltage.

Figure 6:
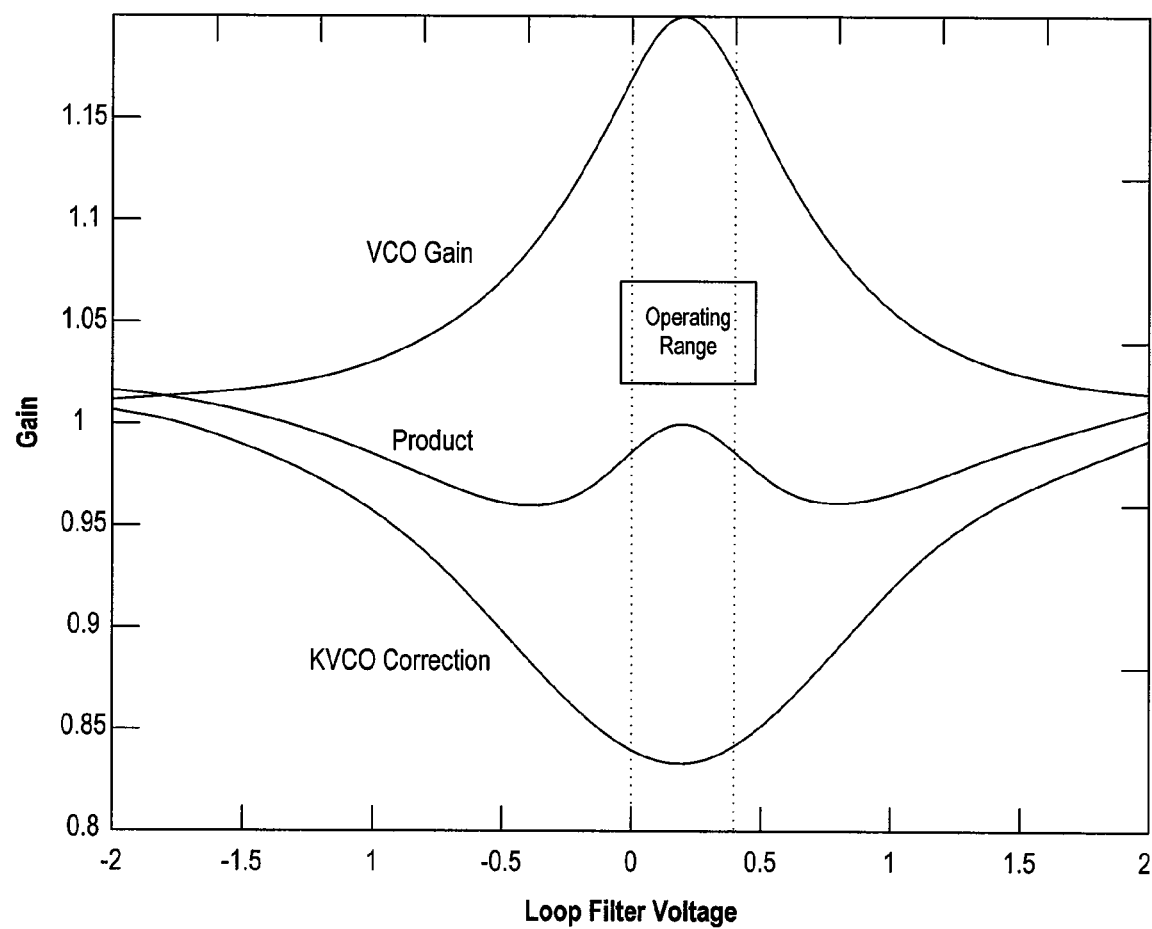
FIG. 6 is a graph illustrating VCO gain, KVCO correction, and a resulting product.

Further, the product of the Kvco gain curve and the Kvco gain correction response is ideally a constant. The problem with this is that the Kvco gain is dependent on fixed capacitors, varactors, inductors and various parasitics whereas the Kvco gain correction response is primarily dependent on NMOS devices. Variations in process, temperature and voltage will result in a final product that is not constant, as shown in FIG. 6. FIG. 6 illustrates a VCO gain, a KVCO correction response, and a product of those two. As can be seen, when the VCO gain and KVCO correction are multiplied, the overall response is closer to constant than the VCO gain alone, but it is not completely constant.

The invention seeks to minimize this source of error by switching in sufficient numbers of fixed capacitors (TUNE0 through TUNE<n> as shown in the LC Tank VCO Schematic of FIG. 3). The current invention seeks to achieve this by holding the VCO control voltages equal to the required offset as described above (i.e. VCN=VCMN and VCP=VCMP). The frequency of oscillation is measured and compared to the reference and fixed capacitors are added or removed to bring the oscillation frequency as close as possible to the reference frequency. This allows the VCO and Kvco gain correction circuit to operate in a small range (shown above) reducing the effect of mismatches between the two.

As one of ordinary skill in the art will appreciate, various changes, substitutions, and alternations could be made or otherwise implemented without departing from the principles of the present invention. Accordingly, the examples and drawings disclosed are for purposes of illustrating the preferred embodiments of the present invention and are not to be construed as limiting the invention.

We claim:

1. A phase-locked loop, comprising: a phase detector configured to compare a phase of a first signal and a second signal, wherein the phase detector is further configured to generate a third signal based, at least in part, on the comparison; a charge pump coupled to the phase detector and configured to receive the third signal and an input current, wherein the charge pump is further configured to generate a fourth signal based, at least in part, on the input current and the third signal; a voltage-controlled oscillator coupled to the charge pump and configured to receive a differential control signal based, at least in part, on the fourth signal, wherein the voltage-controlled oscillator is further configured to generate at least one of the first or second signals based, at least in part, on the differential control signal; and a differential gain linearization circuit coupled to the charge pump and configured to receive an offset signal and the differential control signal, wherein the differential gain linearization circuit is further configured to adjust the input current provided to the charge pump based, at least in part, on the offset signal and the differential control signal, wherein the differential gain linearization circuit is further configured to provide an output current, and wherein the differential gain linearization circuit comprises: a first transistor having a first size, wherein the first transistor includes: a first gate terminal configured to receive one end of the differential control signal; a first source/drain terminal configured to provide at least a portion of the output current; and a second source/drain terminal; a second transistor having a second size, wherein the second transistor includes: a second gate terminal configured to receive the one end of the differential control signal; a third source/drain terminal; and a fourth source/drain terminal; a third transistor having the first size, wherein the third transistor includes: a third gate terminal configured to receive the offset voltage; a fifth source/drain terminal coupled to the first source/drain terminal and configured to provide another portion of the output current; and a sixth source/drain terminal coupled to the fourth source/drain terminal; and a fourth transistor having the second size, wherein the fourth transistor includes: a fourth gate terminal configured to receive the offset voltage; a seventh source/drain terminal coupled to the third source/drain terminal; and an eighth source/drain terminal coupled to the second source/drain terminal.

2. The phase-locked loop of claim 1, wherein the voltage-controlled oscillator comprises a programmable load, and wherein a center frequency of the voltage-controller oscillator is based, at least in part, on a capacitance of the programmable load.

3. The phase-locked loop of claim 2, wherein the programmable load comprises a plurality of capacitors coupled in parallel to an output of the voltage-controlled oscillator.

4. The phase-locked loop of claim 1, wherein the voltage-controlled oscillator comprises an adjustable current source and an inductor coupled to the adjustable current source.

5. The phase-locked loop of claim 1, further comprising a loop filter coupled between the charge pump and the voltage-controlled oscillator, wherein the loop filter is configured to receive the fourth signal and generate the differential control signal.

6. The phase-locked loop of claim 1, further comprising a frequency divider coupled between the voltage-controlled oscillator and the phase detector, wherein the frequency divider is configured to reduce a frequency of the first or second signal.

7. The phase-locked loop of claim 1, wherein the offset signal corresponds to a desired center voltage of the voltage-controlled oscillator.

8. The phase-locked loop of claim 1, wherein the voltage-controlled oscillator has a gain configured to vary in accordance with the differential control signal, and wherein the differential gain linearization circuit is further configured to adjust the input current provided to the charge pump such that the input current provided to the charge pump varies in accordance with the differential control signal inversely to the gain of the voltage-controlled oscillator.

9. The phase-locked loop of claim 1, further comprising:
a first bias current source coupled to the fourth and sixth source/drain terminals; and
a second bias current source coupled to the second and eighth source/drain terminals.

* * * * *